(12) United States Patent
Kato et al.

(10) Patent No.: US 9,439,285 B2
(45) Date of Patent: Sep. 6, 2016

(54) DEVICE MOUNTING BOARD AND SEMICONDUCTOR POWER MODULE

(71) Applicant: SANYO ELECTRIC CO., LTD., Osaka (JP)

(72) Inventors: Keishi Kato, Aichi (JP); Osamu Tabata, Gifu (JP); Yoshio Okayama, Shiga (JP); Ryosuke Usui, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 213 days.

(21) Appl. No.: 14/092,054

(22) Filed: Nov. 27, 2013

(65) Prior Publication Data

US 2014/0085834 A1    Mar. 27, 2014

Related U.S. Application Data

(63) Continuation of application No. PCT/JP2012/004774, filed on Jul. 26, 2012.

(30) Foreign Application Priority Data

Jul. 29, 2011  (JP) .................................. 2011-167774

(51) Int. Cl.
*H05K 1/14*    (2006.01)
*H05K 1/05*    (2006.01)
(Continued)

(52) U.S. Cl.
CPC ............... *H05K 1/053* (2013.01); *H01L 23/13* (2013.01); *H01L 23/142* (2013.01);
(Continued)

(58) Field of Classification Search
CPC .......... H01L 21/4846; H01L 21/6835; H01L 23/142; H01L 23/3121; H01L 23/498; H01L 23/49861; H01L 25/072; H01L 23/13; H01L 23/48961; H01L 24/49; H01L 24/48; H01L 24/97; H01L 24/24; H01L 2224/48091; H01L 2224/49113; H01L 2224/48227; H01L 2224/48247; H01L 2224/32188; H01L 2224/48472; H01L 2924/19107; H01L 2924/13055; H01L 2924/1305; H01L 2924/13091; H01L 2924/1435; H01L 2924/1431; H01L 2924/1438; H01L 2924/181; H01L 2924/15787; H01L 2924/01012; H01L 2924/15311; H01L 2924/00014; H01L 2924/12041; H05K 1/053; H05K 1/0215; H05K 1/0216; H05K 1/0203; H05K 2201/10166; H05K 2201/09972; H05K 2203/0323; H05K 2203/0315
USPC .................. 174/251, 258, 255; 29/382, 832; 361/739
See application file for complete search history.

(56) References Cited

U.S. PATENT DOCUMENTS 5,767,573 A * 6/1998 Noda et al. .................... 257/675
2002/0030266 A1* 3/2002 Murata ............. H01L 23/49827
257/698

(Continued)

FOREIGN PATENT DOCUMENTS

JP    60-072296 A    4/1985
JP    62-029193 A    2/1987
(Continued)

OTHER PUBLICATIONS

International Search Report, w/ English translation thereof, issued in International Application No. PCT/JP2012/004774 dated Oct. 23, 2012.

*Primary Examiner* — Timothy Thompson
*Assistant Examiner* — Guillermo Egoavil
(74) *Attorney, Agent, or Firm* — McDermott Will & Emery LLP

(57) ABSTRACT

In the upper surface of a metallic substrate, a region near the central part of the metallic substrate is surrounded by a rectangle having dotted sides electrically separate the interior and exterior of the rectangle. Each dot of the sides is formed of a pillared insulating resin that penetrates from the upper surface to the lower surface of the metallic substrate. Oxide films are so formed as to fill in the spaces between adjacent cylinders of insulating resins and the surrounding of the cylinders. That is, a separation layer is formed of the pillared insulating resins and the oxide films that fill up the spaces between the pillared insulating resins as well as their vicinities.

19 Claims, 7 Drawing Sheets

(51) Int. Cl.
*H01L 23/14* (2006.01)
*H01L 23/13* (2006.01)
*H01L 23/00* (2006.01)
*H01L 25/07* (2006.01)
*H05K 1/02* (2006.01)

(52) U.S. Cl.
CPC ............ *H05K 1/0216* (2013.01); *H01L 24/48* (2013.01); *H01L 24/49* (2013.01); *H01L 25/072* (2013.01); *H01L 2224/48091* (2013.01); *H01L 2224/48227* (2013.01); *H01L 2224/49113* (2013.01); *H01L 2924/1305* (2013.01); *H01L 2924/13055* (2013.01); *H01L 2924/13091* (2013.01); *H01L 2924/1431* (2013.01); *H01L 2924/1435* (2013.01); *H01L 2924/1438* (2013.01); *H01L 2924/19107* (2013.01); *H05K 1/0203* (2013.01); *H05K 1/0215* (2013.01); *H05K 2201/09972* (2013.01); *H05K 2201/10166* (2013.01); *H05K 2203/0315* (2013.01); *H05K 2203/0323* (2013.01)

(56) References Cited

U.S. PATENT DOCUMENTS

| | | | |
|---|---|---|---|
| 2013/0037309 A1* | 2/2013 | Kim | .............. H01L 21/6835 174/251 |
| 2014/0084458 A1* | 3/2014 | Huang | .............. H01L 23/481 257/737 |

FOREIGN PATENT DOCUMENTS

| | | | | |
|---|---|---|---|---|
| JP | 62029193 A | * | 2/1987 | |
| JP | 63-301547 A | | 12/1988 | |
| JP | 05-291746 A | | 11/1993 | |
| JP | 06-077614 A | | 3/1994 | |
| JP | 06077614 A | * | 3/1994 | .............. H05K 1/05 |
| JP | 06-188363 A | | 7/1994 | |
| JP | 06-288606 A | | 10/1994 | |
| JP | 2007-081100 A | | 3/2007 | |
| JP | 2012-513128 A | * | 6/2012 | |
| WO | 02/14400 A1 | | 2/2002 | |
| WO | WO 2011136417 A1 | * | 11/2011 | |
| WO | WO 2012046934 A1 | * | 4/2012 | |

* cited by examiner

DEVICE MOUNTING BOARD AND SEMICONDUCTOR POWER MODULE

RELATED APPLICATIONS

This application is a Continuation of International Application No. PCT/JP2012/004774, filed on Jul. 26, 2012, which in turn claims the benefit of Japanese Application No. 2011-167774, filed on Jul. 29, 2011, the disclosures of which Applications are incorporated by reference herein.

BACKGROUND OF THE INVENTION

1. Field of the Invention

The present disclosure relates to a circuit board and, more particularly, to a device mounting board, which mounts a plurality of kinds of modules thereon, and a semiconductor module using said device mounting board.

2. Description of the Related Art

In recent years, along with increasing high function and high performance of LSIs (Large Scale Integrated Circuits), their power consumption is on the increase. With electronic devices getting smaller, mounting boards are also required to be smaller and high-density and multilayered (see Japanese Laid-Open Patent Applications S63-301547 and S60-072296, and International Patent Application WO 2002/014400, for instance). Accordingly, the power consumption per unit volume (heat density) of a circuit board rises. Thus the need for measures to address the increased heat radiation is increasing.

On the other hand, a semiconductor power module is used as a power conversion apparatus, which regulates the power supplied to a load, in a wide range of fields including electric appliances and industrial equipment (see Japanese Laid-Open Patent Applications H06-188363 and H06-288606, for instance). Here, the semiconductor power module is comprised of a power circuit module including a power semiconductor device (power device) and a control circuit module including a control device that controls and drives said power circuit module.

As disclosed in Japanese Laid-Open Patent Application S63-301547, the power circuit and the control circuit are fabricated as separate modules using separate substrates, and then they are contained in the same casing. In this structure as disclosed in the Related Art, it is difficult to downsize the module as a whole. On the other hand, when the power circuit and the control circuit are mounted on a metallic substrate and then this substrate is used as the ground electrode, in order to both downsize the module and improve the heat radiation property, noise generated by the power circuit sneaks around to the control circuit via the metallic substrate and this noise in turn may cause improper operations in some cases.

RELATED ART LIST

Japanese Published Patent Application S63-301547
Japanese Published Patent Application S60-072296
International Patent Application No. WO 2002/014400
Japanese Published Patent Application H06-188363
Japanese Published Patent Application H06-288606

SUMMARY OF THE INVENTION

The present disclosure has been made in view of the foregoing circumstances, and one non-limiting and exemplary embodiment provides a technology capable of suppressing troubles caused by the interference, between devices via the substrate, such as noise sneaking around, even though a plurality of kinds of devices are mounted.

One embodiment of the present disclosure relates to a device mounting board. The device mounting board includes: a metallic substrate having one main face; and a separation layer that includes an arrangement of a plurality of pillared through-holes that run in a direction that intersects with the main face of the metallic substrate, and metallic oxides formed in between adjacent through-holes, respectively, in the arrangement thereof, wherein the metallic substrate has at least two regions that are electrically insulated by the separation layer.

Another embodiment of the present disclosure relates to a semiconductor power module. The semiconductor power module mounts a power device and a control device for controlling the power device on a device mounting board, and the device mounting board includes: a metallic substrate having one main face; a separation layer that includes an arrangement of a plurality of pillared through-holes that run in a direction that intersects with the main face of the metallic substrate, and metallic oxides formed in between adjacent through-holes, respectively, in the arrangement thereof; and an insulating layer and a wiring layer formed on the metallic substrate, wherein the metallic substrate has a plurality of regions that are electrically insulated by the separation layer, and wherein the control device and the power device are mounted thereon such that the control device and the power device are placed separately on different regions, respectively, in the plurality of regions.

Additional benefits and advantages of the disclosed embodiments will be apparent from the specification and Figures. The benefits and/or advantages may be individually provided by the various embodiments and features of the specification and drawings, and need not all be provided in order to obtain one or more of the same.

These general and specific aspects may be implemented using a system, a method, and a computer program, and any combination of systems, methods, and computer programs.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION

The disclosure will now be described by reference to the exemplary embodiments. This does not intend to limit the scope of the present disclosure, but to exemplify the disclosure.

A device mounting board according to the present exemplary embodiment is used as a substrate that mounts a plurality of kinds of devices and modules. Thereby, improper interference, between devices and modules via the substrate, such as the sneaking of noise can be prevented from occurring. Though the module mounted on the device mounting board is not limited to any particular one, a description will be therefore given hereinbelow of a case where the device mounting board is used to mount a semiconductor power module as a typical example. In order to first clarify the advantageous effects of the device mounting board in the present exemplary embodiment, a description is now given of a general configuration of the semiconductor power module using a common substrate.

Since high voltages are applied to the semiconductor power module, a large amount of heat is generated. Thus, for the purpose of improving the heat radiation property, proposed is a configuration where the semiconductor power module is mounted on a metallic substrate. The use of an aluminum alloy, which is light-weight and excels in the thermal conductivity, as the metallic substrate is generally practiced.

Figure 1:
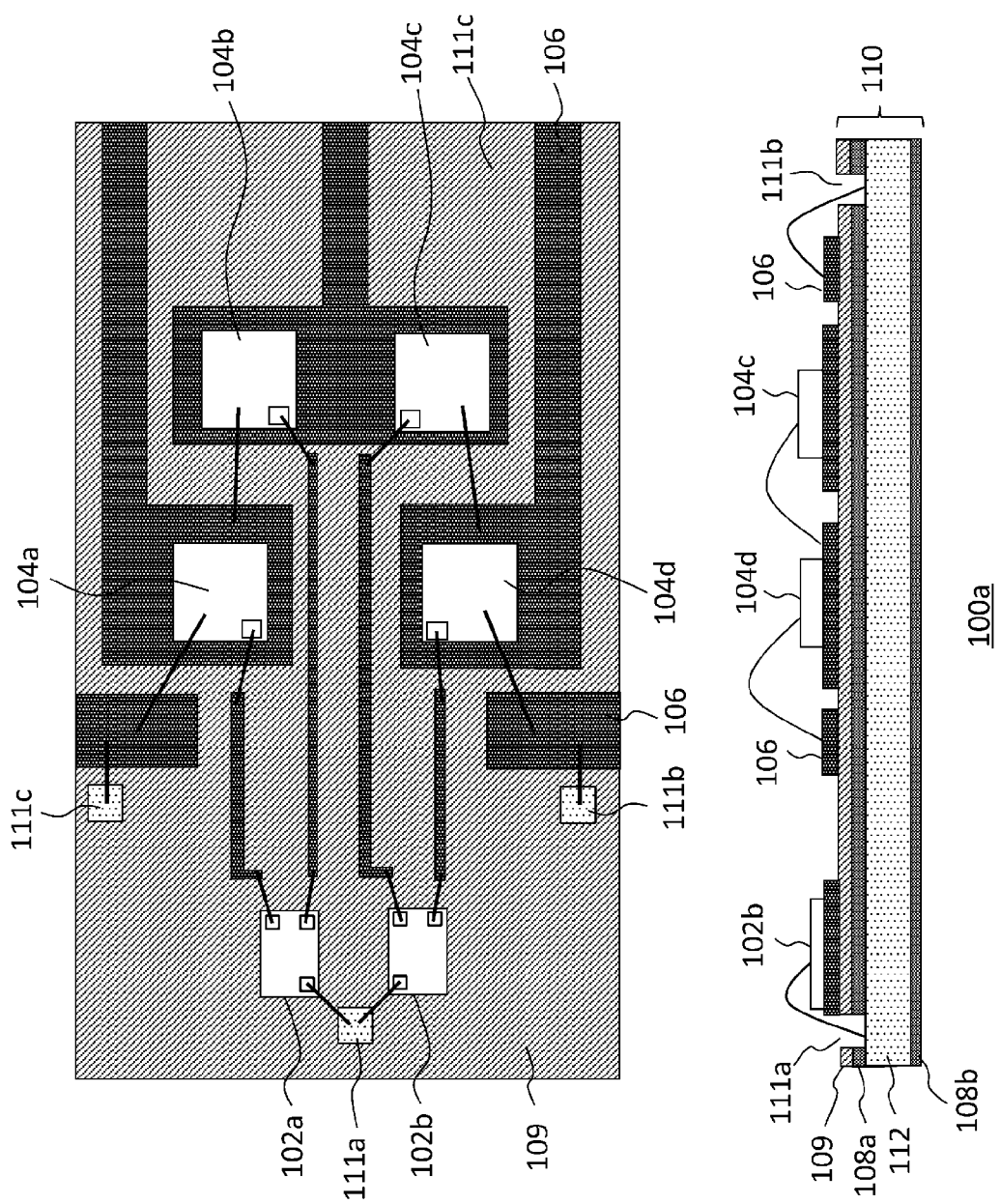
FIG. 1 shows a general structure of a semiconductor power module where devices are mounted on a metallic substrate.

FIG. 1 shows a general structure of a semiconductor power module where devices are mounted on a metallic substrate such as an aluminum alloy. The upper figure in FIG. 1 is a top view of a circuit configuration as seen from top of the semiconductor power module, and the lower figure in FIG. 1 is a side view thereof as seen from a side thereof. Note that the lower figure is the side view drawn in such a manner as to include all of the representative components of the semiconductor power module and does not necessarily show any specific cross-sectional profiles of components depicted in the top view. A semiconductor power module 100a shown in FIG. 1 includes control devices 102a and 102b and power devices 104a, 104b, 104c and 104d. The control devices 102a and 102b each generates a control signal based on an input signal (not shown). Then the control device 102a outputs the control signal to the power devices 104a and 104b, and the control device 102b outputs the control signal to the power devices 104c and 104d.

The control devices 102a and 102b are each used to convert a control signal fed from a logic IC, which is called a driver IC, into a control signal with which to sufficiently charge or discharge the gate capacitance of the power devices. The control devices 102a and 102b may include a signal processor, RAM (Random-Access Memory), flash memory and the like. The power supply voltage of the control devices 102a and 102b is generally low and is about 15V. Thus the amount of heat generated by the control devices 102a and 102b is relatively low.

The power devices 104a, 104b, 104c and 104d are required to have a drive capability sufficient to efficiently drive a load such as a fan motor. Accordingly, a discrete device, such as a MOS (Metal Oxide Semiconductor) transistor, a bipolar transistor, or an insulated gate bipolar transistor is well-suited for the power devices 104a, 104b, 104c and 104d. The power devices 104a, 104b, 104c and 104d tend to generate more heat due to Joule heat when the equipment load to be driven is large. Thus the power devices 104a, 104b, 104c and 104d generate more heat than the control devices 102a and 102b do.

As illustrated in FIG. 1, the control signal sent from the control device 102a is inputted to gates of the power devices 104a and 104b, whereas the control signal from the control device 102b is inputted to gates of the power devices 104c and 104d. Also, sources and drains of the power devices 104a, 104b, 104c and 104d are connected to any one of a power supply wiring, a ground wiring and output lines, as appropriate. As a result, a not-shown load circuit connected to the output lines is driven according to the control signals sent from the control devices 102a and 102b.

The operations of the control devices 102a and 102b and the power devices 104a, 104b, 104c and 104d are not limited to any particular ones since those devices can employ a general technology of the semiconductor power module. A description is given hereunder of a substrate by directing attentions mainly to the substrate that mounts those devices. In the example shown in FIG. 1, a substrate 110 is a metallic substrate and is comprised of a metal layer 112, oxide film layers 108a and 108b, and an insulating resin layer 109. The control devices 102a and 102b, the power devices 104a, 104b, 104c and 104d and a wiring layer 106 are formed on the insulating resin layer 109, which is the topmost surface of the substrate 110. This construction and structure enable each device to be integrated on the substrate, thereby realizing a semiconductor power module that excels in the heat radiation.

In such a case, openings 111a, 111b and 111c are formed in the oxide film layer 108a and the insulating resin layer 109, which are the two uppermost layers of the substrate 110, and the devices and wirings are connected by wires in the openings. Thereby, the metal layer 112 can be used as ground electrodes by both the control devices and the power devices. With this configuration, however, the metal layer 112 may possibly be a path along which the noise generated by the power devices, whose power supply voltage is high, sneaks around to the control devices. For this reason, in the present exemplary embodiment, the metal layer is electrically separated while the integrity of the substrate is kept intact. This suppresses the sneaking of noise and improves the electric characteristics of the module.

Figure 2:
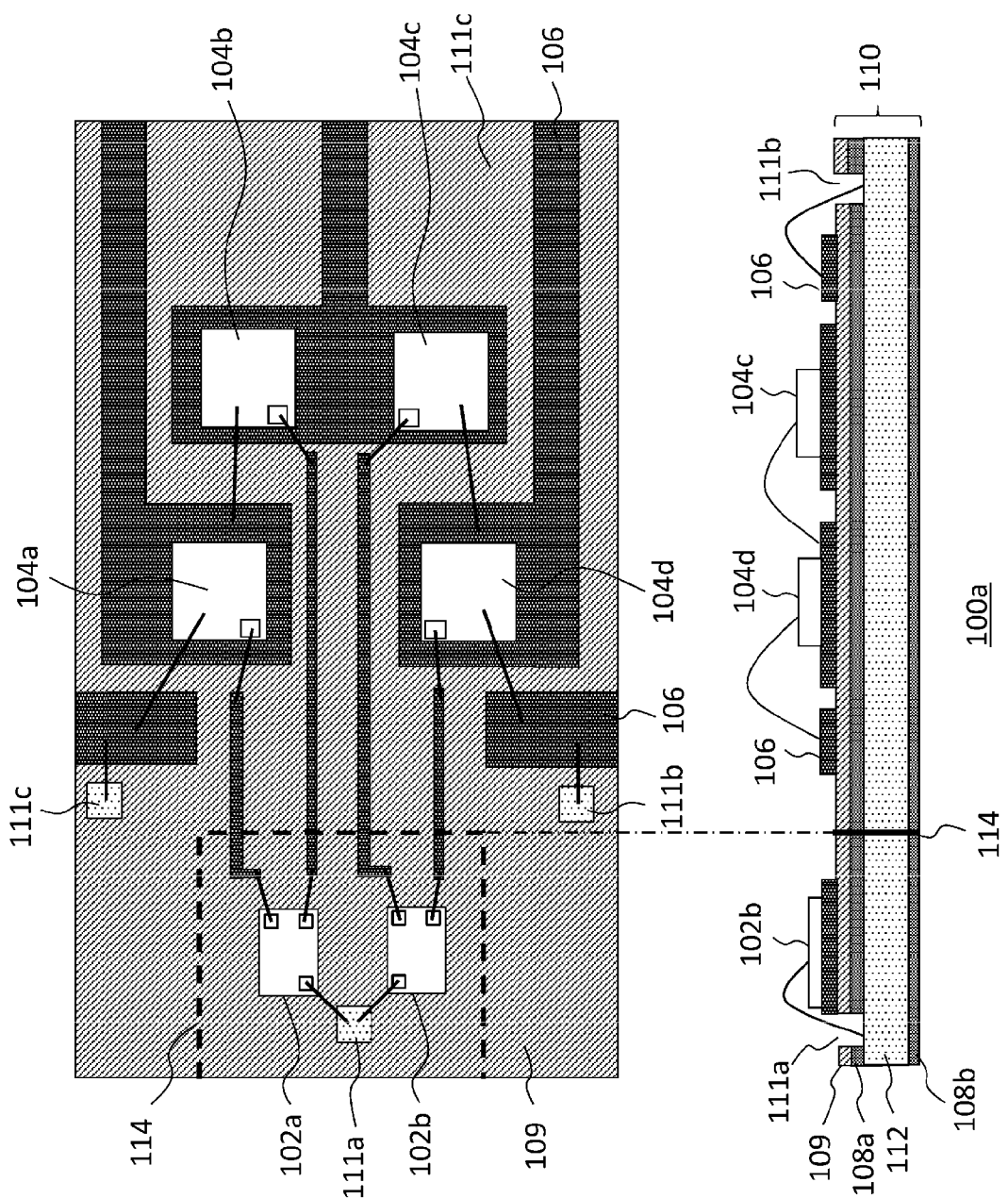
FIG. 2 shows a structure of a semiconductor power module, using a substrate, according to an exemplary embodiment.

FIG. 2 shows a structure of a semiconductor power module, using a substrate, according to the present exemplary embodiment. Similar to FIG. 1, the upper figure in FIG. 2 is a top view of a circuit configuration as seen from top of the semiconductor power module, and the lower figure in FIG. 2 is a side view thereof as seen from a side thereof. As compared with the semiconductor power module 100a shown in FIG. 1, each device and the wiring layer shown in FIG. 2 are the same as those of FIG. 1 but a semiconductor power module of FIG. 2 differs in the feature that a region for the control devices and a region for the power devices are separated and demarcated by a separation layer 114, which is also called as a metal oxide region, that surrounds the control devices 102a and 102b. Hereinafter, the region within which the control devices are provided will be referred to as a "control section region" and the region within which the power devices are provided will be referred to as a "power section region".

The separation layer 114 is constructed of an insulating layer formed in such a manner as to penetrate the substrate 110 from the upper surface to the lower surface in the thickness direction of the substrate 110. With this structure, the ground electrode in the control section region and the ground electrode in the power section region can be electrically separated from each other, so that the noise resistance of the control devices can be enhanced. To achieve both the integrity of the metallic substrate and the electrical separation in the metallic substrate, the separation layer 114 is configured as follows.

Figure 3:
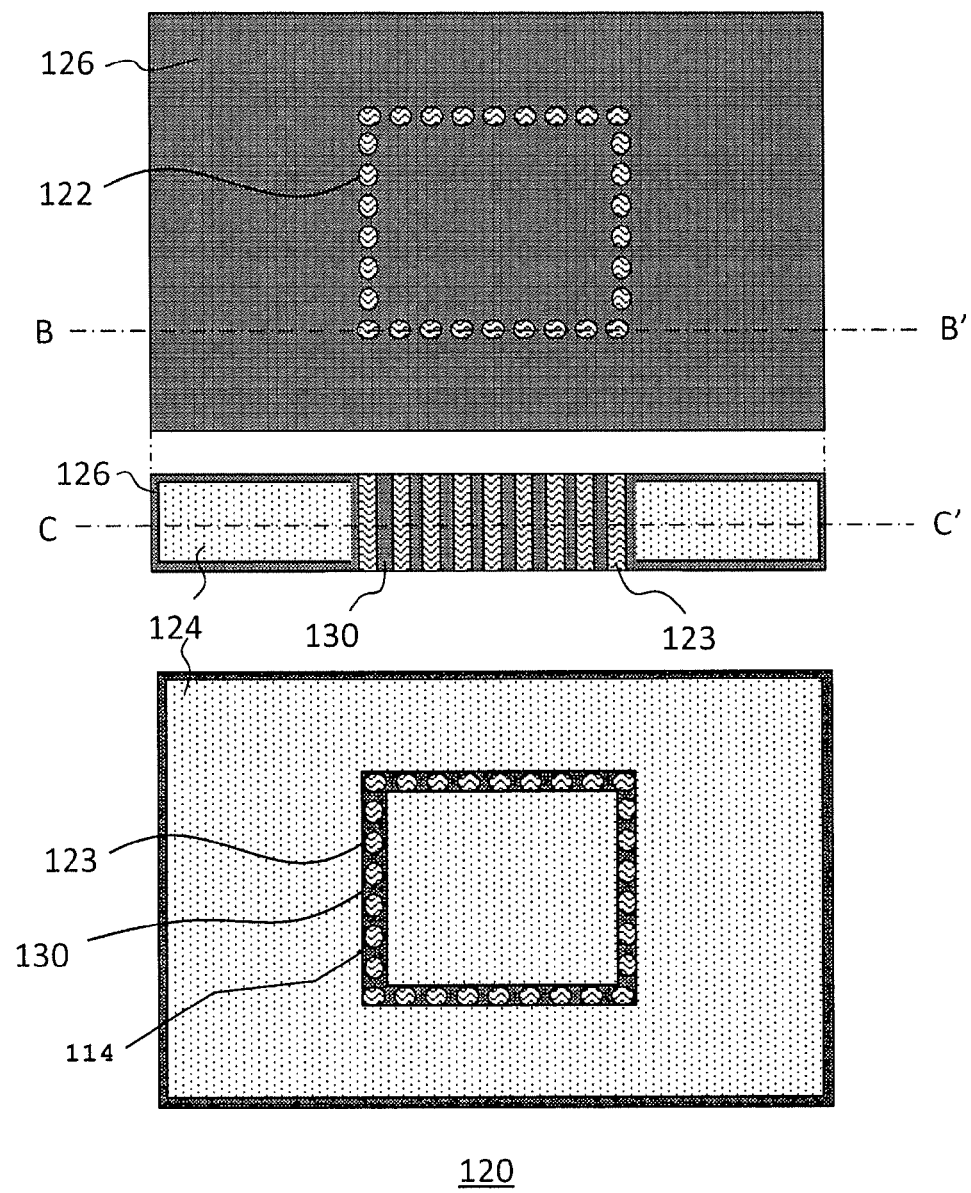
FIG. 3 shows a structure of a metallic substrate, where an area is separated by an separation layer, according to an exemplary embodiment.

FIG. 3 shows a structure of a metallic substrate, where the substrate area is separated by the separation layer, according to the present exemplary embodiment. The top figure in FIG. 3 is a top view as seen from top of the metallic substrate. The middle figure in FIG. 3 is a vertical cross-sectional view of a metallic substrate taken along the line B-B' of the upper figure. The bottom figure is a horizontal cross-sectional view of the metallic substrate taken along the line C-C' of the middle figure. As shown in the top figure, in the upper surface of a metallic substrate 120, a region near the central part of the metallic substrate 120 is surrounded by a rectangle having dotted sides 122 (boundary line). These sides 122 form the separation layer 114 that electrically separates the interior and exterior of the rectangle.

According to the vertical cross-sectional view of the middle figure and the horizontal cross-sectional view of the bottom figure, each dot of the sides 122 is formed of a pillared insulating resin 123 that penetrates from the upper surface to the lower surface of the metallic substrate 120. Also, oxide films 130 are so formed as to fill in the spaces between adjacent cylinders of insulating resins 123 and the surrounding of the cylinders thereof. In other words, the separation layer 114, or the metal oxide region, is formed of the pillared insulating resins 123 and the oxide films 130 that fill up the spaces between the pillared insulating resins 123 as well as the vicinity thereof. The areas other than the boundary line (the dotted sides 122), namely the exterior region and interior region separated by the separation layer, are formed of a metal layer 124 and oxide film layers 126 formed on top and underside of the metal layer 124. If the substrate is used as a device mounting board, an insulating resin layer may be further formed on top of the upper oxide film layer 126.

Figure 4:
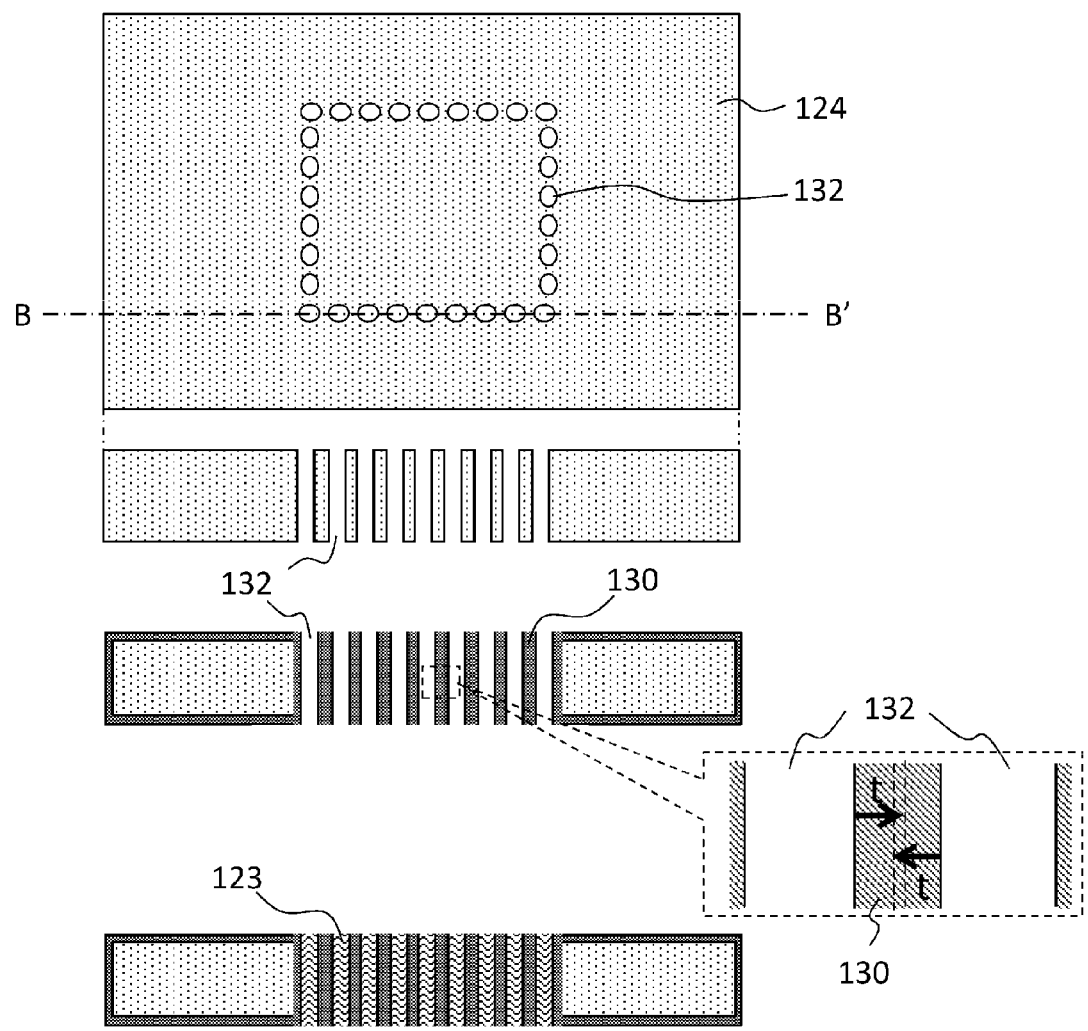
FIG. 4 illustrates a procedure for forming the metallic substrate shown in FIG. 3.

FIG. 4 illustrates a procedure for forming the metallic substrate 120 shown in FIG. 3. Vertical through-holes 132 having openings in the upper surface and the lower surface of the metal layer 124 are formed in a substrate, using a drill (see the top view (the top figure in FIG. 4) and the side view (the second top figure in FIG. 4). The thickness of the substrate used here, which is formed only of the metal layer 124, is 1.5 mm. A metal constituting the metal layer 124 may be selected, as appropriate, from among aluminum, magnesium, titanium, and the like. A plurality of through-holes 132 are provided so that the plurality of through-holes 132 are formed side by side along the boundary line of regions to be separated. The interval between the openings may be about 15 μm to 100 μm in consideration of the formation of oxide films at a later stage. The size of the opening may be determined, as appropriate, in consideration of the interval of the openings and the thickness of the substrate in a manner such that a sufficient strength can be assured with the substrate in the process of forming the openings and the subsequent processes.

Though the boundary line in FIG. 3 and FIG. 4 is of a rectangular shape, the shape of the boundary line may be any one of a variety of shapes, including a straight line and a curve, such as a polygon, a circle, an ellipse, a semicircle, and the like and may be determined based on the topology and arrangement of the devices and the like. Also, as shown in FIG. 2, the regions to be separated may be provided such that the boundary line of the regions to be separated contains one or two sides of the substrate. Though the openings in FIG. 3 and FIG. 4 are each an ellipse in shape, the shape of the openings may be a circle or the like. Examples of forms suitable for the region surrounded by the boundary line will be discussed later.

Then, the surface of the substrate is oxidized (see the second from the bottom figure in FIG. 4). If, for example, an aluminum alloy is used as the substrate, the surface of the aluminum alloy will be oxidized by using a commonly-used anodic oxidation technique so as to form alumite (anodized aluminum). Through this process, an inner side wall of each through-hole is also oxidized as shown in the second from the bottom in FIG. 4. If, in so doing, the film thickness of the oxide film is denoted by t μm, the interval of the openings will be set to 2t μm or less, so that the oxide film can fill in between adjacent through-holes. Simultaneously, the oxide films are formed on top of and underside of the substrate as well.

Then, an insulating resin is embedded into the through-holes 132 using a commonly-used embedding technique. Here, the embedding technique is, for example, to embed a pasty and sheet-like resin material and harden it using a squeegee. As a result, the pillared insulating resins 123 are formed (see the bottom figure in FIG. 4). The insulating resin 123 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like, for instance. A commonly-used technique may be used to carry out the subsequent processes such as the formation of a wiring layer, mounting each device and wire bonding.

A description is now given of exemplary shapes and arrangements of the power section region and the control section region when the metallic substrate, which has been electrically separated by the thus formed separation layer, is used in the semiconductor power module. As described earlier, in the present exemplary embodiment, the shape of the regions to be separated by the separation layer is not limited to any particular one. Also, the separation layer, which may be of a closed curve or polygon in shape as seen from top, may be formed, in an island-like shape, in a region spaced apart from an edge of the substrate. Or the separation layer may be formed in an edge of the substrate. However, in one embodiment where the substrate is linearly divided into two regions, the balance of the strength in the substrate needs to be taken into account.

If an island-like region is formed by the separation layer and if the metallic substrate in this region is used as the ground electrode, the wiring used to ground the substrate for this region will be formed separately. If the substrates according to the present exemplary embodiments are used in the semiconductor power module, various advantageous effects will be achieved when the region surrounded by the separation layer is used as the control section region and the region exterior to this region surrounded thereby is used as the power section region. However, the present exemplary embodiments are not limited to such arrangements.

Figure 5:
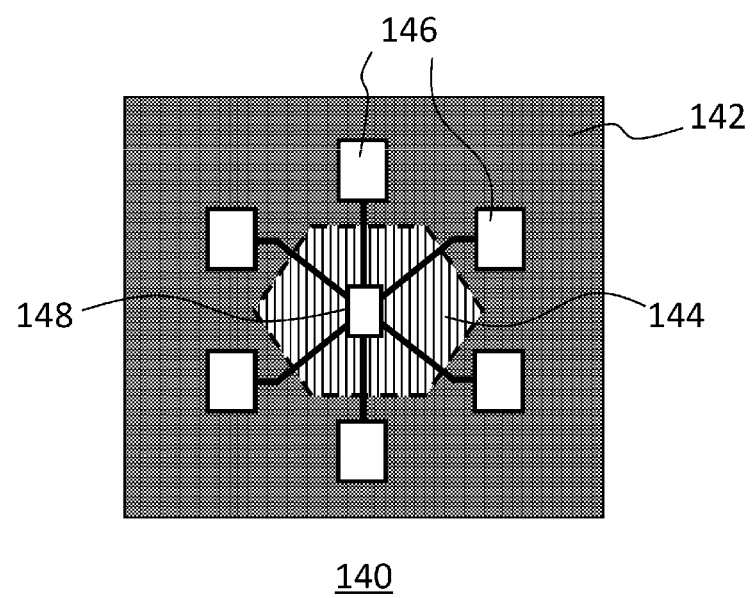
FIG. 5 illustrates an exemplary arrangement and shape of a control section region in a case when there are six power devices.

FIG. 5 illustrates an exemplary arrangement and shape of the control section region in a case when there are six power devices in a three-phase inverter. FIG. 5 shows an arrangement of power section region, control section region, power devices and control device as seen from top of a substrate 140. In this example, a control section region 144 has a shape of regular hexagon and is arranged in an approximately central part of the substrate 140 and thereby the control section region 144 is surrounded by a power section region 142. A control device 148 is placed in the center of the control section region 144, and each power device 146 is placed near each of six sides of the control section region 144.

With such a shape employed as shown in FIG. 5, not only the guidance or drawing of wiring can be simplified but also the distances between the power devices 146 and the control device 148 can be made approximately uniform among all of the power devices. Thus, the power devices 146 can be controlled evenly in terms of the time required for the transmission and receiving of signals and the noise occurrence. Also, the area of the control section region 144 can be increased without increasing the distance between the control device 148 and the power devices 146. This enlarges the area of the ground electrode relative to the control device 148 while the module size is suppressed as a whole, thereby strengthening the ground.

Also, when the control device 148 is connected to the power devices 146 via a wiring layer, the ratio of a part of the wirings located on the control section region 144 over the entire wirings can be made larger. Thus, the sneaking of noise around to the control device 148 can be further reduced. Though FIG. 5 shows an example suitable for the case where there are six power devices 146, the similar advantageous effects can be achieved if the control section region is similarly arranged as a regular N-gon for N power devices.

Figure 6:
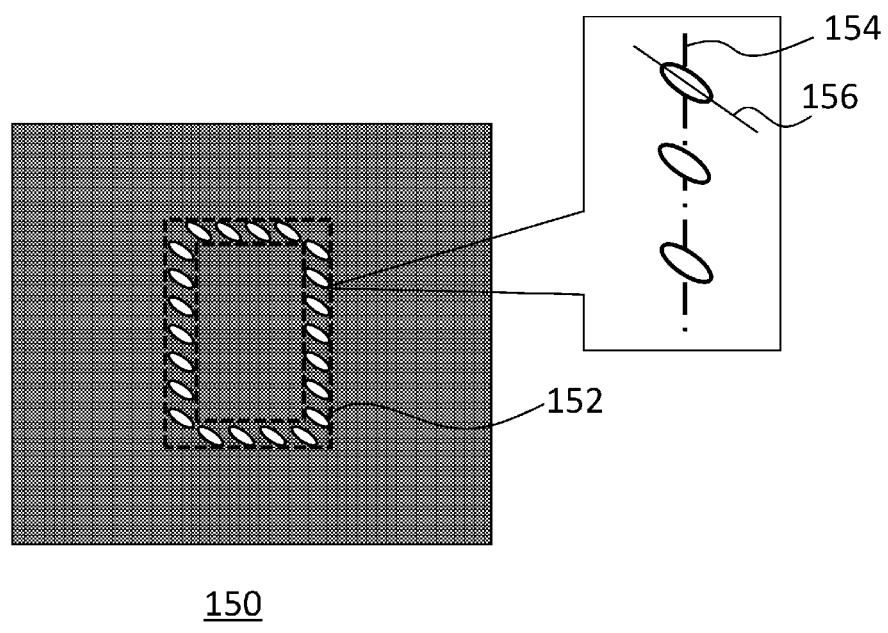
FIG. 6 illustrates a modification to an exemplary embodiment concerning a microscopic structure of a separation layer.

A description is next given of modifications to the present exemplary embodiments, regarding a microscopic structure of the separation layer. FIG. 6 illustrates a shape of a separation layer 152 as seen from top of a substrate 150 according to a modification. In the example shown in FIG. 3, the major axis of the ellipse, which is an opening of the through-hole filled with the insulating resin, and the axis of the array of the ellipses, namely the central axis of the separation layer on a substrate plane, are coincident. In contrast, in the example shown in FIG. 6, the separation layer is formed such that all the major axes 156 of ellipses each intersect obliquely at a predetermined angle with a central axis 154 of the separation layer.

Figure 7:
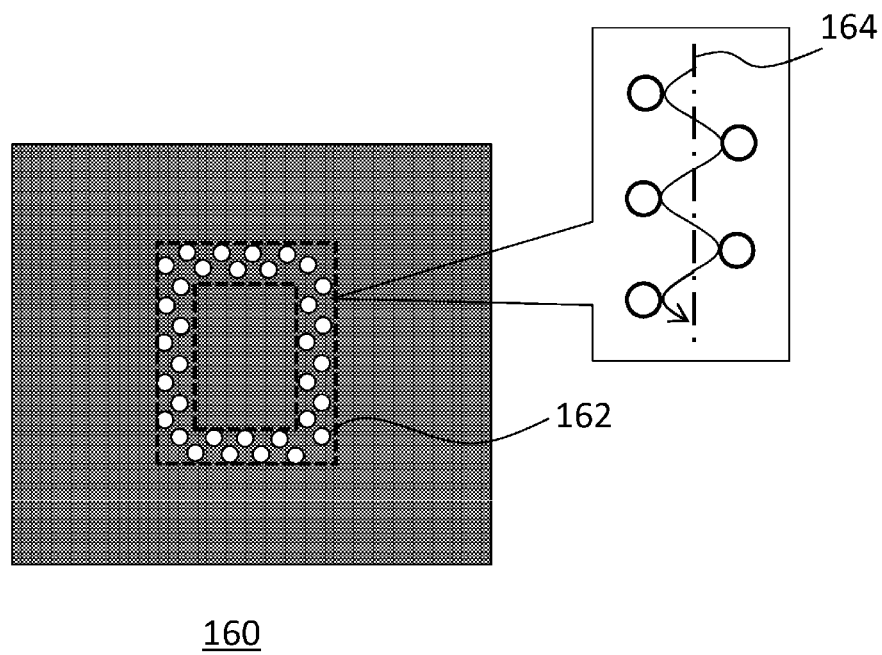
FIG. 7 illustrates another modification to an exemplary embodiment concerning a microscopic structure of a separation layer.

FIG. 7 illustrates a shape of a separation layer 162 as seen from top of a substrate 160 according to another modification. In the example shown in FIG. 7, each opening is of a circular shape and the through-holes are arranged in such a manner as to meander relative to a central axis 164 of the separation layer. In the configurations shown in FIG. 6 and FIG. 7, too, the distance between adjacent through-holes is determined such that an oxide film growing from a given through-hole reaches an oxide film grown from its adjacent through-hole. As a result, the substrate is electrically separated while the integrity of the substrate is kept intact.

Even though the distance between the through-holes is determined as described above, the stress can be dispersed and the strength of the substrate can be maintained by devising the shape, orientation and arrangement of the openings as described in conjunction with FIG. 6 and FIG. 7. Furthermore, the thickness of the separation layer can be adjusted as described in conjunction with FIG. 3, FIG. 6 and FIG. 7, so that an optimum shape and form can be selected in consideration of a module area permitted and noise reduction effect.

By employing the above-described exemplary embodiments, a semiconductor power module is formed such that a plurality of through-holes are formed in line in a metallic substrate on which devices are mounted. And the oxide film is formed by the anodic oxidation or the like so as to form an insulating film in between adjacent through-holes. This can create an insulation state in the array of through-holes despite the fact that the control section region and the power section region are physically connected to each other in the metallic substrate. Furthermore, the embedding of the insulating resin in the through-holes can maintain the strength of the substrate.

By applying the thus formed metallic substrate to the semiconductor power module, the region where the power devices are mounted and the region where the control devices are mounted are insulated from each other, thereby providing separate ground electrodes in the power section region and the control section region, respectively. As a result, malfunctions such as improper operations of the module caused when noise generated in part of the power devices sneaks around to the control devices can be minimized. Also, the phase-blocks in a three-phase inverter can be separated, so that the electric characteristics of the module as a whole can be improved.

The present disclosure has been described based on the exemplary embodiments. The exemplary embodiments are intended to be illustrative only, and it is understood by those skilled in the art that various modifications to constituting elements or an arbitrary combination of each process could be further developed and that such modifications are also within the scope of the present disclosure.

What is claimed is:

1. A device mounting board comprising a metallic substrate which has a first face and a second face opposed to the first face, the metallic substrate including:
   a plurality of through-holes each extending from the first face to the second face; and
   a metallic oxide region existing entirely between each adjacent two of the plurality of through-holes, for electrically isolating the metallic substrate into at least two metallic regions, wherein
   the metallic oxide region extends from one edge of the metallic substrate when viewed from a direction perpendicular to the first face.

2. The device mounting board according to claim 1, further comprising:
   a metallic oxide film covering the first face of the metallic substrate, wherein
   the metallic oxide film contains a same metallic oxide as that of the metallic oxide region.

3. The device mounting board according to claim 1, wherein the metallic substrate further includes a plurality of insulative resins which fill in the plurality of through-holes.

4. The device mounting board according to claim 2, wherein the metallic substrate further includes a plurality of insulative resins which fill in the plurality of through-holes.

5. The device mounting board according to claim 1, wherein the metallic oxide region has a polygonal ring shape or a curved ring shape when viewed from a direction perpendicular to the first face.

6. The device mounting board according to claim 1, wherein each of the plurality of through-holes has an elliptical opening of which a major axis coincides with a direction along which the plurality of through-holes are arranged.

7. The device mounting board according to claim 1, wherein each of the plurality of through-holes has an elliptical opening of which a major axis is inclined to a direction along which the plurality of through-holes are arranged.

8. The device mounting board according to claim 1, wherein the plurality of through-holes are meanderingly arranged.

9. The device mounting board according to claim 1, wherein the metallic oxide region contains a same metal element as that of the at least two metallic regions.

10. A semiconductor power module comprising:
a device mounting board which includes a metallic substrate having a first face and a second face opposed to the first face, an insulative film disposed on the first face of the metallic substrate, and a wiring region disposed on the insulative film, wherein the metallic substrate includes a plurality of through-holes each extending from the first face to the second face, and a metallic oxide region existing entirely between each adjacent two of the plurality of through-holes, for electrically isolating the metallic substrate into at least two metallic regions;
a power device mounted on one of the at least two metallic regions of the metallic substrate, and
a controller mounted on another of the at least two metallic regions of the metallic substrate.

11. A device mounting board comprising a metallic substrate which has a first face and a second face opposed to the first face, the metallic substrate including:
a plurality of through-holes each extending from the first face to the second face; and
a metallic oxide region existing entirely between each adjacent two of the plurality of through-holes, for electrically isolating the metallic substrate into at least two metallic regions;
an insulative film disposed on the first face of the metallic substrate; and
a wiring region disposed on the insulative film.

12. The device mounting board according to claim 11, further comprising:
a metallic oxide film covering the first face of the metallic substrate, wherein
the metallic oxide film contains a same metallic oxide as that of the metallic oxide region.

13. The device mounting board according to claim 11, wherein the metallic substrate further includes a plurality of insulative resins which fill in the plurality of through-holes.

14. The device mounting board according to claim 12, wherein the metallic substrate further includes a plurality of insulative resins which fill in the plurality of through-holes.

15. The device mounting board according to claim 11, wherein the metallic oxide region has a polygonal ring shape or a curved ring shape when viewed from a direction perpendicular to the first face.

16. The device mounting board according to claim 14, wherein each of the plurality of through-holes has an elliptical opening of which a major axis coincides with a direction along which the plurality of through-holes are arranged.

17. The device mounting board according to claim 11, wherein each of the plurality of through-holes has an elliptical opening of which a major axis is inclined to a direction along which the plurality of through-holes are arranged.

18. The device mounting board according to claim 11, wherein the plurality of through-holes are meanderingly arranged.

19. The device mounting board according to claim 11, wherein the metallic oxide region contains a same metal element as that of the at least two metallic regions.

* * * * *